US005781029A

United States Patent [19]

Baran

[11] Patent Number: 5,781,029

[45] Date of Patent: Jul. 14, 1998

[54] BROADBAND MATCHING TECHNIQUE FOR HIGH SPEED LOGIC AND HIGH RESOLUTION VIDEO SIGNALS

[75] Inventor: Jozef B. Baran, Irvine, Calif.

[73] Assignee: AST Research, Inc., Irvine, Calif.

[21] Appl. No.: 706,816

[22] Filed: Sep. 3, 1996

[51] Int. Cl.$^6$ .............................. G09G 5/12; H03K 17/16

[52] U.S. Cl. .............................................. 326/30; 345/211

[58] Field of Search .................................. 326/30, 82, 86, 326/62; 345/211

[56] References Cited

U.S. PATENT DOCUMENTS

| | | | |
|---|---|---|---|
| 3,456,206 | 7/1969 | Kwartiroff et al. . | |
| 4,220,867 | 9/1980 | Ray | 326/30 X |
| 4,612,576 | 9/1986 | Hinn . | |
| 4,908,842 | 3/1990 | Collins . | |
| 5,208,562 | 5/1993 | Schirm, IV . | |
| 5,262,859 | 11/1993 | Ishii et al. | 358/142 |
| 5,285,197 | 2/1994 | Schmidt et al. . | |
| 5,523,703 | 6/1996 | Yamamoto et al. | 326/30 |
| 5,565,896 | 10/1996 | Suski | 345/211 |

OTHER PUBLICATIONS

No Date.

*Primary Examiner*—Jon Santamauro

*Attorney, Agent, or Firm*—Knobbe, Martens, Olson & Bear, LLP

[57] ABSTRACT

A termination circuit for RGB signal lines provides a high frequency termination impedance that matches the impedance of a monitor cable and monitor termination, without adversely affecting the monitor-sense circuitry of an ASIC that generates the RGB video signals. The termination circuit includes a first resistor connected in parallel with a diode. The diode is reversed biased when a DC voltage is present on a VGA line. The parallel circuit is connected in series with a second resistor such that at DC the termination circuit has a resistance equal to the sum of the resistances of the two resistors. At high frequencies the termination circuit has a resistance equal to the second resistor. When used with a VGA ASIC designed to work with 150Ω pull-down sense resistors on the RGB lines, the circuit provides the proper 75Ω AC termination impedance required for VGA lines while producing the 150Ω DC termination required for proper monitor sense operation.

11 Claims, 3 Drawing Sheets

BROADBAND MATCHING TECHNIQUE FOR HIGH SPEED LOGIC AND HIGH RESOLUTION VIDEO SIGNALS

BACKGROUND OF THE INVENTION

1. Field of the Invention

This invention relates to transmission lines and associated circuitry for providing computer video signals to a monitor. In particular, this invention relates to termination circuits for RGB signal lines that connect a Video Graphics Array (VGA) chip to a monitor.

2. Description of the Related Art

Personal computers (PCs) that support the various Video Graphics Array (VGA) display modes commonly use a commercially available VGA application specific integrated circuit (VGA ASIC) to generate video signals from data stored in video memory. The VGA ASIC outputs three analog video signals, one for each of the colors red, green and blue. The red, green and blue output signals are provided on a set of RGB lines that connect the RGB pins of the VGA ASIC to a standard 15-pin display connector. The red, green and blue video signals are passed to a color monitor via a monitor cable, and control the red, green and blue electron beams of the monitor. When a monochrome monitor is connected to the PC, only the green signal is passed to the monitor (i.e., no connection is made between the monitor and the red and blue signal lines).

Commercially available VGA ASICs normally support one or more display modes that are compatible with monochrome monitors. To permit automatic selection of an appropriate display mode, a monitor-sense circuit is included within the VGA ASIC. The monitor-sense circuit determines the monitor type (typically following a system reset) by effectively measuring the DC resistance on each of the RGB signal lines. This is done by placing a known DC current on each RGB line and measuring the DC voltage on the line. Alternatively, the monitor-sense circuit may place a known DC voltage on each line and measure the resulting current. When an RGB line from the ASIC is not connected to the monitor (as is the case for the red and blue RGB lines when a monochrome monitor is connected to the PC), the DC resistance measured by the monitor-sense circuit is equal to the resistance of a termination resistor connected at the PC end (or "ASIC end") of the RGB line. When the RGB line is connected to a monitor, the DC resistance seen by the monitor-sense circuit is approximately equal to the resistance of the termination resistor at the ASIC end in parallel with a termination resistor at the monitor end. The monitor-sense circuit can thus determine which, if any, of the RGB lines from the ASIC are connected to a monitor, and thus determine whether a monitor is monochrome or color. Once this determination is made, a BIOS routine or dedicated hardware can be used to select an appropriate display mode.

By definition, VGA lines are 75Ω transmission lines. Thus, in order to match the AC impedances of both the VGA monitor cable and the termination at the monitor end, each RGB line must have a 75Ω termination at the ASIC end. A number of VGA chip manufacturers, however, have erroneously designed their VGA ASICs to work with 150Ω current sense pull-down resistors on the RGB lines. According to "engineering folklore," this design error is the result of a mistake made by IBM in the early 1980s, in which IBM used 150Ω termination resistors on a VGA video board schematic. The error was quickly copied by the industry, and remains as a feature of a variety of commercially available VGA ASICs.

Failure to use 150Ω pull-down termination resistors with these erroneously designed ASICs can cause the monitor-sense circuit to fail by affecting the DC current or voltage induced during the monitor sense operation. Personal computer manufacturers that use these ASICs have therefore chosen to use the recommended 150Ω pull-down resistors on the RGB lines to assure that the ASIC will correctly sense the monitor type, ignoring the impedance discontinuity that results on each RGB line. These impedance discontinuities cause signal reflections that reduce the quality of the color signals received by the monitor. The impedance discontinuities also increase the radiated emissions from the RGB lines.

SUMMARY OF THE INVENTION

The present invention is directed to an RGB termination circuit that solves the above-described problem. The circuit effectively shorts out a second 75Ω resistor connected in series with each of the 75Ω termination resistors at high frequencies using diodes (such as the Motorola MBRS170T3) which approximate short circuits at such frequencies. A high frequency impedance equal to 75Ω is thereby obtained, while maintaining the 150Ω DC termination (i.e., the series combination of the two 75Ω resistors) required by the monitor-sense circuit.

In accordance with one embodiment of the invention, there is thus provided a termination circuit for an RGB signal line from an ASIC, comprising a first resistor connected in series with a second resistor. The series combination of the first and second resistor is connected between the signal line and a voltage reference. The first resistor has a resistance substantially equal to an AC impedance of the signal line. The AC impedance is different than a DC termination resistance required for proper operation of the monitor sense circuit. A diode is connected in parallel with the second resistor. The diode is reversed biased (effectively an open circuit) when the ASIC senses the monitor type. Thus, the DC termination resistance is substantially equal to the resistance of the series combination of the first and second resistors. This allows the monitor-sense circuit to operate properly. During the normal transmission of video signals, the diode approximates a short circuit with respect to the high frequency components of the signal, effectively shorting out the second resistor, and coupling the first resistor between the signal line and the voltage reference. A high frequency impedance that matches the AC impedance of the signal line is thus obtained. A significant improvement in signal quality and a reduction in radiated emissions is thereby obtained over the prior art.

In another preferred embodiment of the present invention, the voltage reference to which the parallel combination of the second resistor and the diode is connected is an analog ground that is AC isolated from a logic ground used for digital logic circuitry.

Another aspect of the present invention is a method of providing a termination impedance on a signal line. The termination impedance matches an AC impedance of the signal line, without affecting the operation of a monitor-sense circuit of an ASIC. A first resistance is provided in series with a second resistance between the signal line and a voltage reference. The first resistance has a resistance that is substantially equal to the AC impedance of the signal line. The series combination of the first resistance and the second resistance are within a range necessary for the proper operation of the monitor-sense circuit. A diode is provided in parallel with the second resistance. The diode is reverse biased when the monitor-sense circuit senses the monitor type so that the DC termination resistance is substantially equal to the resistance of the series combination of the first resistor and the second resistor. The diode approximates a short circuit at high frequencies to provide a high frequency termination impedance that substantially matches the resistance of the first resistor.

In still another method of providing a substantially constant AC termination impedance on a transmission line over a wide range of frequencies, a diode is selected which approximates a short circuit over a range of signal frequencies. The range of signal frequencies encompass all frequency components that are susceptible to reflection within the transmission signals provided on the transmission line. A transmission line termination circuit is formed by connecting the diode in parallel with at least a first resistance to form a parallel combination, and by connecting the parallel combination in series with an AC termination circuit. The transmission line termination circuit is connected to the transmission line such that the diode is reverse biased when a DC voltage is provided on the transmission line.

Yet another method of providing a substantially constant AC termination impedance on a transmission line over a wide range of frequencies includes selecting a frequency responsive device. The frequency responsive device approximates a short circuit over a range of signal frequencies which encompass all frequency components that are susceptible to reflection within the transmission signals provided on the transmission line. A transmission line termination circuit is formed by connecting the frequency responsive device in parallel with at least a first resistance to form a parallel combination. The parallel combination is placed in series with an AC termination circuit. The transmission line termination circuit is connected to the transmission line so that the frequency responsive device has a high impedance when a DC voltage is provided on said transmission line. In particularly preferred embodiment, the frequency responsive device is diode.

DETAILED DESCRIPTION OF THE PREFERRED EMBODIMENT

Figure 1:
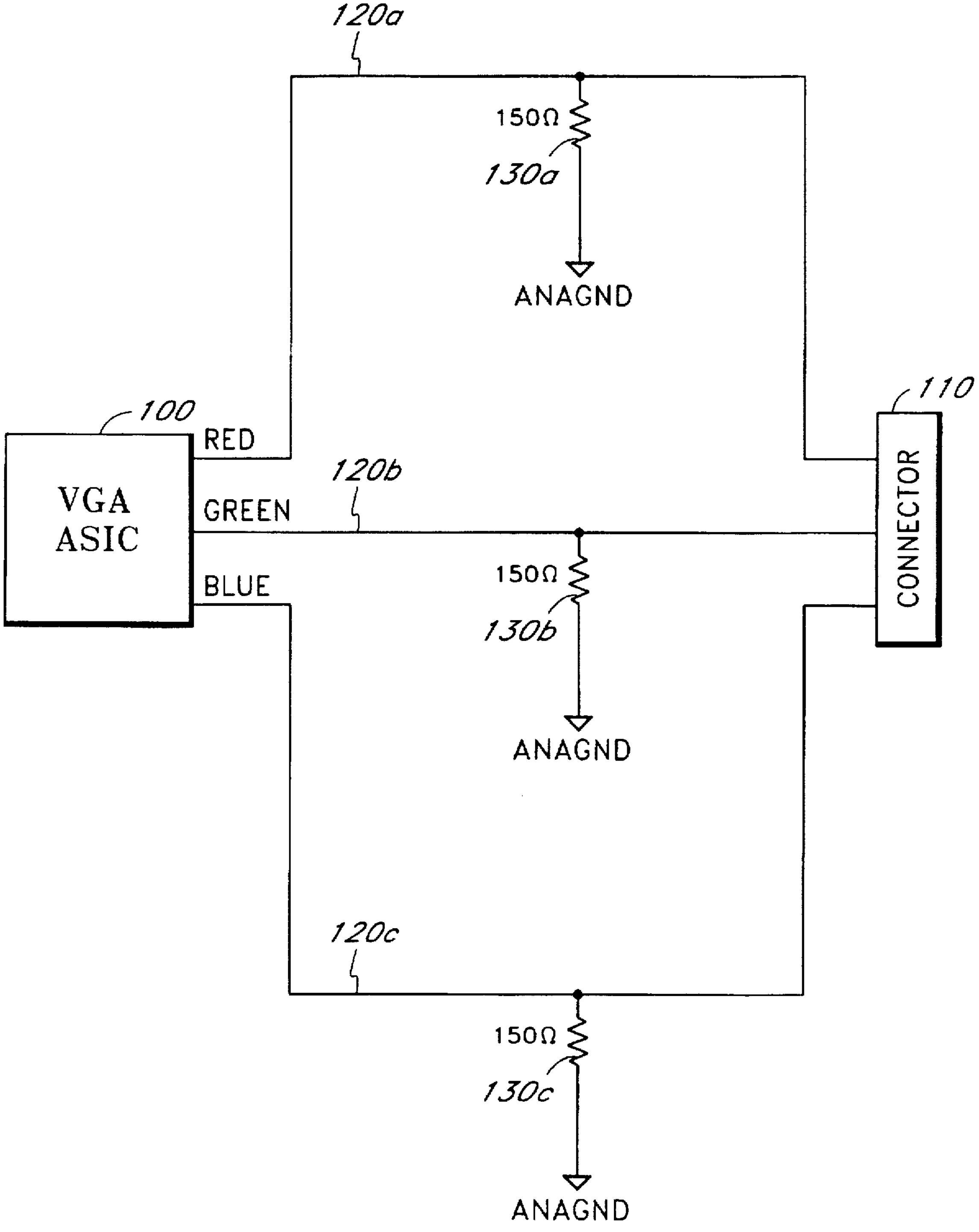
FIG. 1 (PRIOR ART)
FIG. 1 is a circuit diagram illustrating a prior art RGB line termination circuit used with VGA ASICs that are designed for use with 150Ω pull-down sense resistors.

FIG. 1 illustrates a prior art termination circuit for a VGA ASIC 100 designed to operate with 150Ω current sense resistors. The VGA ASIC 100 (hereinafter "ASIC") is connected to a standard 15-pin display connector 110 by RGB lines 120*a*, 120*b* and 120*c* that communicate the red, green and blue video signals respectively. Connections between the ASIC 100 and the connector 110 for the standard horizontal sync and vertical sync video signals are not shown.

Each RGB line 120*a*–120*c* is terminated at the ASIC end with a 150Ω pull-down termination resistor 130*a*–130*c*. Each resistor 130*a*–130*c* is connected between a respective RGB line 120*a*–120*c* and a ground voltage reference (ANAGND). The ground ANAGND is preferably a voltage level that is AC-isolated from the ground level used for logic signals. A monitor-sense circuit (not shown) of the ASIC 100 uses the resistors 130*a*–130*c* to determine the type of monitor connected to the display connector 110. If a monochrome monitor (not shown) is connected to the display connector 110, for example, the ASIC 100 will sense a 150Ω resistance on each of the red signal line 120*a* and the blue signal line 120*c* (since no connection is made by the monochrome monitor to these lines), but will sense a lower resistance on the green signal line 120*b* as that is approximately equal to the resistance of the parallel combination of the 150Ω termination resistor at the ASIC end and a termination resistor (not shown) at the monitor end.

As described above, the 150Ω resistors 130*a*–130*c* do not match the 75Ω impedance of the VGA monitor cable (not shown) and VGA monitor. This impedance discontinuity causes a degradation in the quality of the color signals, and increases radiated emissions. These adverse effects are greater with faster signal rise times on the RGB lines, and generally become a problem for signal edges of 2 ns (nanoseconds) or less. Such edges are especially susceptible to reflection.

Although the impedance discontinuity could be cured by replacing the 150Ω resistors 130*a*–130*c* in FIG. 1 with 75Ω resistors, such a replacement would likely cause the monitor-sense circuit of the ASIC 100 to fail.

Figure 3:
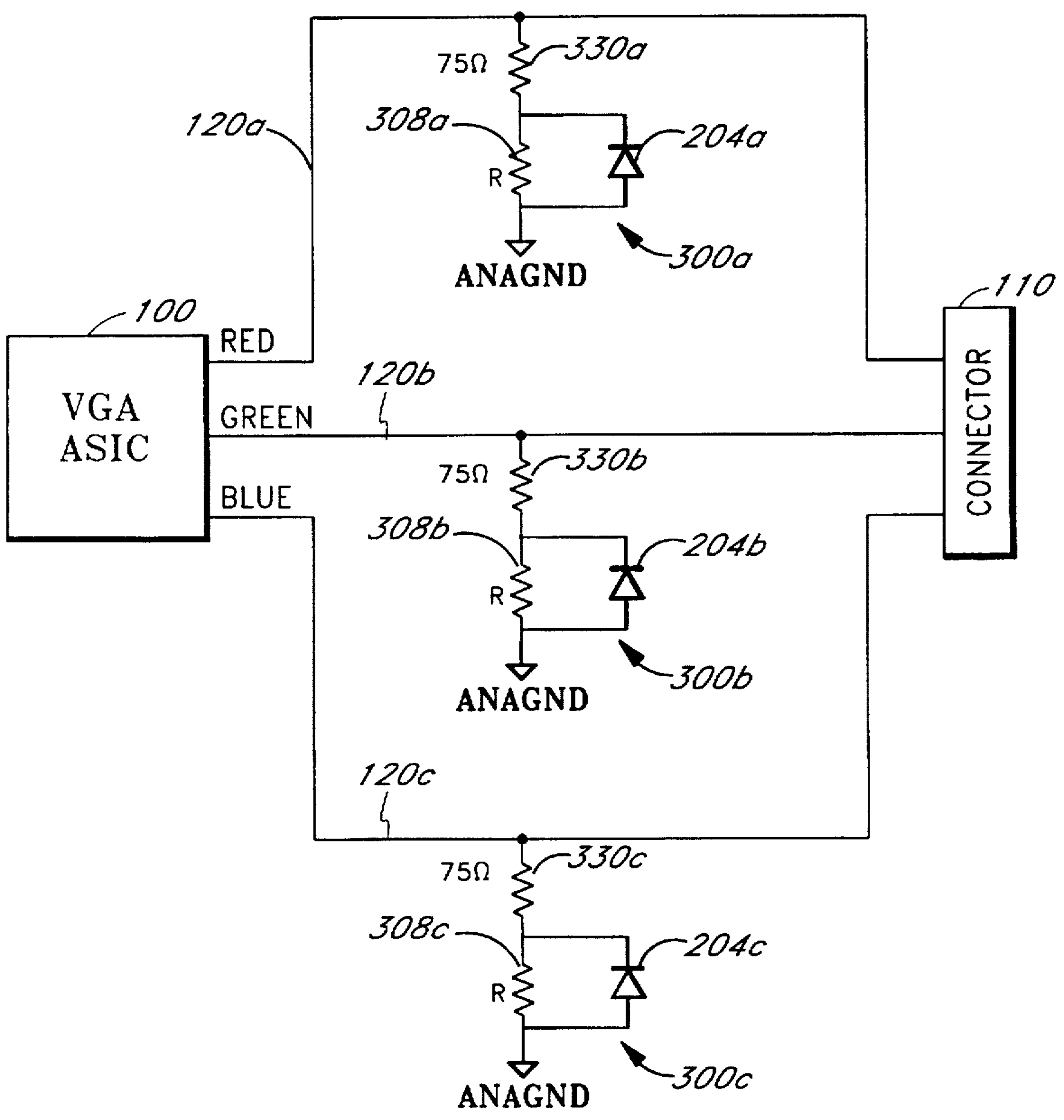
FIG. 3 illustrates an RGB line termination circuit in accordance with the present invention.

The present invention solves this problem by making use of the high frequency characteristics of certain types of diodes. Certain types of fast diodes, such as the Motorola MBRS170T3, effectively become short circuits at the edge rates (i.e., rise and fall times) for which the above-described impedance discontinuity becomes a concern. As illustrated in FIG. 3, the present invention uses such diodes to effectively short-out a second resistor in series with each 75Ω resistor 330*a*–330*c* at high frequencies, to thereby achieve the high frequency impedance of 75Ω.

FIG. 3 illustrates the present invention. The circuit comprises three identical termination circuits 300*a*, 300*b*, and 300*c*, one for each RGB signal line 120*a*, 120*b* and 120*c*. The termination circuit 300*a* for the red signal line 120*a* comprises a 75Ω resistor 330*a* connected in series with a parallel combination of a diode 204*a* and a resistor 308*a*. The termination circuit 300*b* for the green signal line 120*b* comprises a 75Ω resistor 330*b* connected in series with a parallel combination of a diode 204*b* and a resistor 308*b*. The termination circuit 300*c* for the blue signal line 120*c* comprises the 75Ω resistor 330*c* connected in series with a parallel combination of a diode 204*c* and a resistor 308*c*.

Each of the resistors 308*a*–308*c* has a resistance of R, which in the preferred embodiment is 75Ω. The diodes 204*a*–204*c* are preferably fast diodes such as the Motorola MBRS170T3, that approximate short circuits with respect to high frequency signal components associated with edge rates faster than 2 ns.

The operation of the termination circuits 300*a*–300*c* will now be described. To determine the type of monitor connected to the display connector 110, the monitor-sense circuit of the ASIC 100 senses the DC resistance on each RGB line 120*a*–120*c* by placing a DC current (or voltage) on each line 120*a*–120*c* while monitoring the DC voltage (or current) on each such line. The current flow is out of the ASIC 100 during this monitor sense operation. The diodes 204*a*–204*c* are thus reverse biased, and do not conduct enough current to affect the voltage or current sensed during the sensing operation. Thus, the resistors 308*a*–308*c* are in series with the resistors 330*a*–330*c*. The termination resistance $R_T$ is thus given by:

$$R_T = 75\Omega + R \quad (1)$$

Therefore, the desired termination impedance of $R_T=150\Omega$ can be obtained by using resistors 308a–308c that have a resistance of $R=75\Omega$ each. The ASIC 100 thus sees a DC termination resistance of 150Ω on each of the lines 120a–120c, as required for proper sensing of the monitor type.

However, for high frequency components associated with rise times of less than 2 nanoseconds, the diodes 204a–204c approximate short circuits. Thus, at such frequencies, the resistors 308a–308c are effectively shorted out. Therefore, the high frequency resistance $R_{HF}$ of each termination circuit 300a–300c is equal to 75Ω.

Measurements have been taken to verify that the circuit of FIG. 3 produces the desired 75Ω termination impedance over the range of video signal frequencies for which signal reflection is a concern. A comparison of such measurements with measurements for the prior art circuit of FIG. 1 indicates that a significant reflection is effectively eliminated by the addition of the parallel resistor-diode pairs of FIG. 3. A significant improvement in signal quality, in addition to a reduction in radiated emissions, can thus be obtained.

An alternative approach for achieving impedance matching with the VGA monitor cable, while still permitting the monitor-sense circuit of the ASIC 100 to operate, is described in a co-pending application, application Ser. No. 08/610692, having a common assignee with the present application. The approach described in application Ser. No. 08/610692, illustrated in FIG. 2, also makes use of fast diodes which effectively become short circuits at a given range of frequencies. The invention disclosed in the application Ser. No. 08/610692 uses such diodes to effectively place a second resistor in parallel with each 150Ω resistor 130a–130c at high frequencies, to thereby achieve the high frequency impedance of 75Ω.

However, the present invention differs from the invention disclosed in Application Ser. No. 08/610692. The diodes 204a–204c in FIG. 2 each have the entire voltage of their respective signal lines 120a–120c across them. By contrast, in the present invention the voltage $V_D$ across the diodes 204a–204c is:

$$V_D = \text{SIGNAL LINE VOLTAGE} \times \frac{R}{R + 75\Omega} \quad (2)$$

Thus, if R=75Ω, then the voltage across each diode 204a–204c in the present invention will be only one half of the voltage of the respective signal line 120a–120c. Therefore, the voltage across each diode 204a–204c in the present invention is only half of the voltage across the corresponding diodes 204a–204c disclosed by Application Ser. No. 08/610692. Therefore, the diodes 204a–204c in the present invention can switch faster than the diodes 204a–204c. This permits the current invention to be used with much higher frequency signals having faster edge rates compared to the invention disclosed by Application Ser. No. 08/610692.

Figure 2:
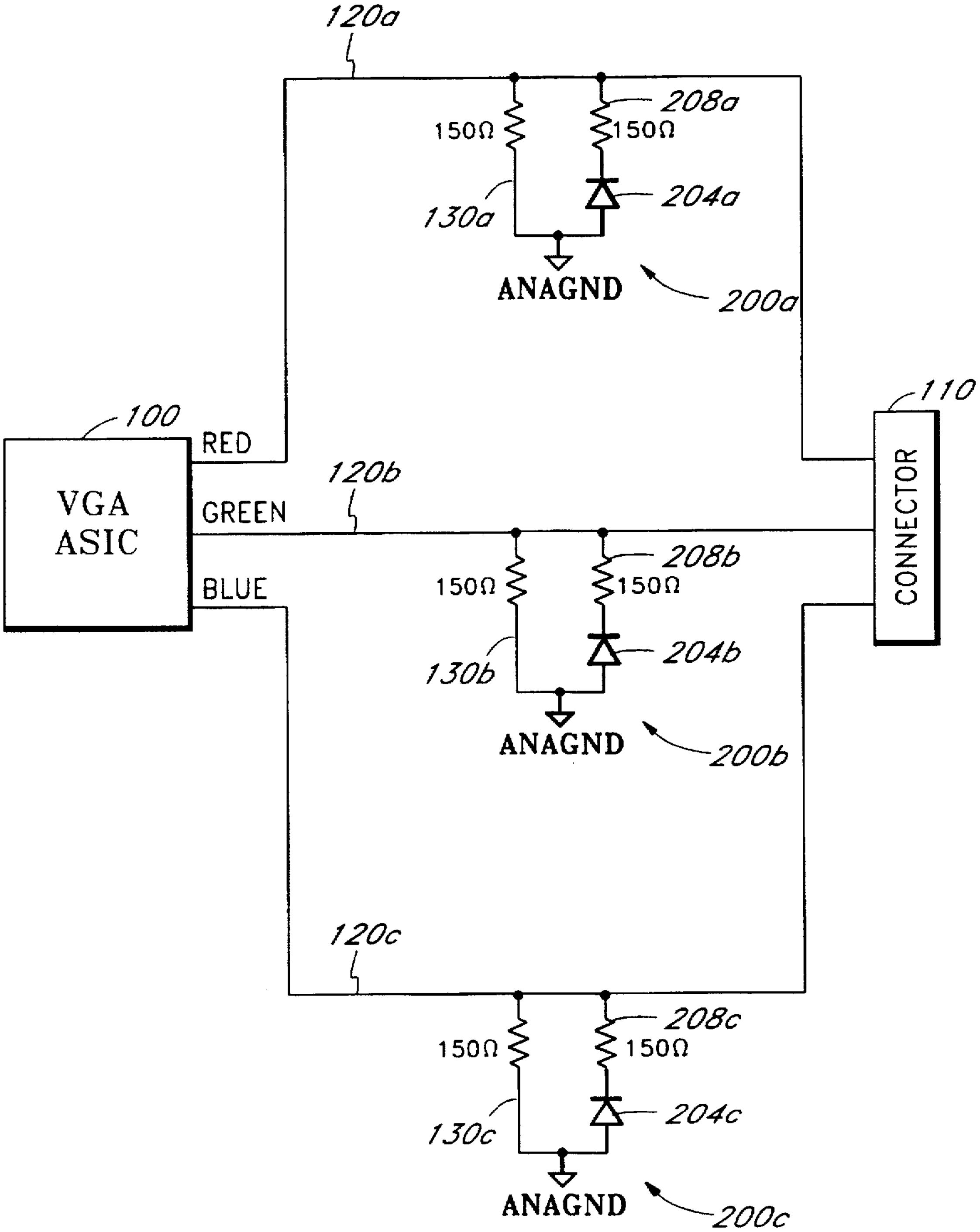
FIG. 2 is a circuit diagram illustrating an alternative RGB line termination circuit which provides 150Ω DC termination and 75Ω AC termination impedance.

Laboratory measurements of VGA waveform rise times and fall times indicate that faster and cleaner rise and fall times are achieved with the parallel resistor-diode pairs of FIG. 3, compared with the performance of the circuit illustrated in FIG. 2. The parallel resistor-diode pairs of FIG. 3 can therefore be used with higher performance graphics systems then can the series resistor-diode pairs of FIG. 2.

The use of diodes in the manner described above raises the question of whether the diodes 204a–204c could be replaced with capacitors that short out at the desired frequency. The problem with the use of capacitors for this purpose is that a capacitor will produce an impedance that varies above and below the capacitor's resonance frequency. This variable impedance makes it difficult to generate a 75Ω termination impedance over the range of high frequencies of concern. Diodes of the type described above more-closely approximate a short circuit at such frequencies and are thus better-suited for the purpose.

It should be noted that it is not essential to the present invention to use an analog ground that is AC isolated from the ground used for digital logic circuitry. The use of an analog ground, however reduces interference in the video signals that can be caused by the switching of digital logic circuitry.

It should be recognized that the circuits of FIG. 3 has applicability outside the context of VGA ASICs. The circuits can be used, for example, whenever an application requires a DC termination resistance for a transmission line that is different than the AC impedance of the transmission line.

The circuit of FIG. 3 is an exemplary embodiment of a termination circuit in accordance with the present invention, and is not intended to limit the scope of the invention. Thus, the breadth and scope of the invention should be defined only in accordance with the following claims and their equivalents.

What is claimed is:

1. A termination circuit for a signal line which carries an analog color signal from an ASIC to a monitor, said ASIC having a monitor-sense circuit to sense the type of the monitor, said termination circuit comprising:

a first resistor connected in series with a second resistor, said series combination of said first and said second resistor connected between said signal line and a voltage reference, said first resistor having a resistance substantially equal to an AC impedance of said signal line, said AC impedance being different than a DC termination resistance required for proper operation of the monitor sense circuit; and a diode connected across said second resistor, said diode being reverse biased when said ASIC senses the monitor type so that the DC termination resistance is substantially equal to the resistance of the series combination of said first resistor and said second resistor, said diode approximating a short circuit at high frequencies to provide a high frequency termination impedance substantially equal to the resistance of said first resistor.

2. The termination circuit according to claim 1, wherein said second resistor provides a resistance that is substantially equal to said one-half of said DC termination resistance.

3. The termination circuit of claim 1, wherein said first resistor and said second resistor each have a resistance of approximately 75 ohms.

4. The termination circuit of claim 1, wherein said voltage reference is an analog ground that is AC isolated from a logic ground used for digital logic circuitry.

5. A method of providing a termination impedance on a signal line which matches an AC impedance of the signal line, without affecting the operation of a monitor-sense circuit of an ASIC which requires a termination resistance which differs from the AC impedance of the signal line, said method comprising the steps of:

providing a first resistance in series with a second resistance between said signal line and a voltage reference, said first resistance having a resistance which is substantially equal to the AC impedance of the signal line, and the series combination of said first resistance and said second resistance being within a range necessary for the proper operation of the monitor-sense circuit; and providing a diode across said second resistance, said diode being reverse biased when the monitor-sense circuit senses the monitor type so that the DC termination resistance is substantially equal to the resistance of the series combination of said first resistor and said second resistor, said diode approximating a short circuit at high frequencies to provide a high frequency termination impedance which substantially matches the resistance of said first resistor.

6. A method of providing a substantially constant AC termination impedance on a transmission line over a wide range of frequencies, comprising the steps of:

selecting a diode which approximates a short circuit over a range of signal frequencies, said range of signal frequencies encompassing all frequency components that are susceptible to reflection within the transmission signals provided on said transmission line;

forming a transmission line termination circuit by connecting said diode across at least a first resistance to form a parallel combination, and by connecting said parallel combination in series with an AC termination circuit; and connecting said transmission line termination circuit to said transmission line such that said diode is reverse biased when a DC voltage is provided on said transmission line.

7. The method according to claim 6, wherein said range of signal frequencies encompasses all frequency components of an RGB video transmission signal that are susceptible to reflection.

8. The method according to claim 6, wherein said first resistance is selected such that an impedance produced by a series combination of said first resistance with said DC termination circuit matches an impedance of said transmission line.

9. The method according to claim 8, wherein said DC termination circuit comprises a second resistance which is selected to enable a monitor-sense circuit on said transmission line to function properly.

10. A method of providing a substantially constant AC termination impedance on a transmission line over a wide range of frequencies, comprising the steps of:

selecting a frequency responsive device which approximates a short circuit over a range of signal frequencies, said range of signal frequencies encompassing all frequency components that are susceptible to reflection within the transmission signals provided on said transmission line;

forming a transmission line termination circuit by connecting said frequency responsive device across at least a first resistance to form a parallel combination, and by connecting said parallel combination in series with an AC termination circuit; and connecting said transmission line termination circuit to said transmission line such that said frequency responsive device has a high impedance when a DC voltage is provided on said transmission line.

11. The method according to claim 10, wherein said frequency responsive device comprises a diode.

* * * * *